United States Patent [19]

Henschen et al.

[11] Patent Number: 5,090,116
[45] Date of Patent: Feb. 25, 1992

[54] METHOD OF ASSEMBLING A CONNECTOR TO A CIRCUIT ELEMENT AND SOLDERING LEAD FRAME FOR USE THEREIN

[75] Inventors: Homer E. Henschen, Carlisle; Michael J. McKee, New Cumberland; Joseph M. Pawlikowski, Lancaster; Richard L. Schaeffer, Carlisle; David T. Shaffer, Mechanicsburg; Alexander M. Sharpe, Harrisburg, all of Pa.

[73] Assignee: AMP Incorporated, Harrisburg, Pa.

[21] Appl. No.: 631,819

[22] Filed: Dec. 21, 1990

[51] Int. Cl.⁵ .................... H01R 43/00; H01R 9/09
[52] U.S. Cl. ........................ 29/827; 29/876; 29/882; 439/79; 439/83; 439/248; 439/876
[58] Field of Search ............... 29/882, 876, 874, 827; 439/79, 65, 248, 83, 876

[56] References Cited

U.S. PATENT DOCUMENTS

| | | | |
|---|---|---|---|
| 4,028,794 | 6/1977 | Ritchie et al. | 29/882 |
| 4,045,868 | 9/1977 | Ammon et al. | 29/882 X |
| 4,256,945 | 3/1981 | Carter et al. | 219/10.75 |
| 4,327,954 | 5/1982 | Aldridge et al. | 439/248 |
| 4,623,401 | 11/1986 | Derbyshire et al. | 148/13 |
| 4,626,767 | 12/1986 | Clappier et al. | 323/280 |
| 4,659,912 | 4/1987 | Derbyshire | 219/535 |
| 4,695,713 | 9/1987 | Krumme | 219/553 |
| 4,701,587 | 10/1987 | Carter et al. | 219/1.75 |
| 4,717,814 | 1/1988 | Krumme | 219/553 |
| 4,728,305 | 3/1988 | Seidler | 439/876 |
| 4,737,115 | 4/1988 | Seidler | 439/876 X |
| 4,745,264 | 5/1988 | Carter | 219/553 |
| 4,769,908 | 9/1988 | Olsson | 439/65 X |
| 4,789,767 | 12/1988 | Doljack | 219/9.5 |
| 4,852,252 | 8/1989 | Ayer | 29/860 |
| 4,903,402 | 2/1990 | Norton et al. | 29/843 |
| 4,925,400 | 5/1990 | Blair et al. | 439/374 |
| 4,987,283 | 1/1991 | Beinhaur et al. | 219/85.11 |
| 4,995,838 | 2/1991 | Ayer et al. | 439/874 |

FOREIGN PATENT DOCUMENTS 0241597 10/1987 European Pat. Off. .

OTHER PUBLICATIONS

U.S. patent application Ser. No. 07/277,095 Henschen et al., filed 11-29-88.
U.S. patent application Ser. No. 07/277,362 Henschen et al., filed 11-29-88.
U.S. patent application Ser. No. 07/277,116 Henschen et al., filed 11-29-88.
U.S. patent application Ser. No. 07/277,170 Henschen et al., filed 11-29-88.
U.S. patent application Ser. No. 07/277,361 Henschen et al., filed 11-29-88.

Primary Examiner—Carl J. Arbes
Attorney, Agent, or Firm—Anton P. Ness

[57] ABSTRACT

A connector (10) having one or more arrays of elongate cantilever beam arms (22) of contacts (20) can have contact sections (26) on free ends (24) thereof soldered to respective traces (94) of a circuit element (90), by securing a lead frame (50) to free ends (24) which includes a corresponding plurality of fingers (56) extending from a carrier strip (52). On the finger ends (58) are affixed preforms (80,82) of solder; on the carrier strip (52) is defined a thin magnetic layer, transforming the brass carrier strip into a Curie point heater. When the carrier strip is subjected to RF current, it generates thermal energy which melts the solder preforms to join the fingers first to the contact sections (26) of the connector contacts (20), and in a remote location later subjected to RF current to reflow solder preform (82) to join contact sections (26) to traces (94).

20 Claims, 8 Drawing Sheets

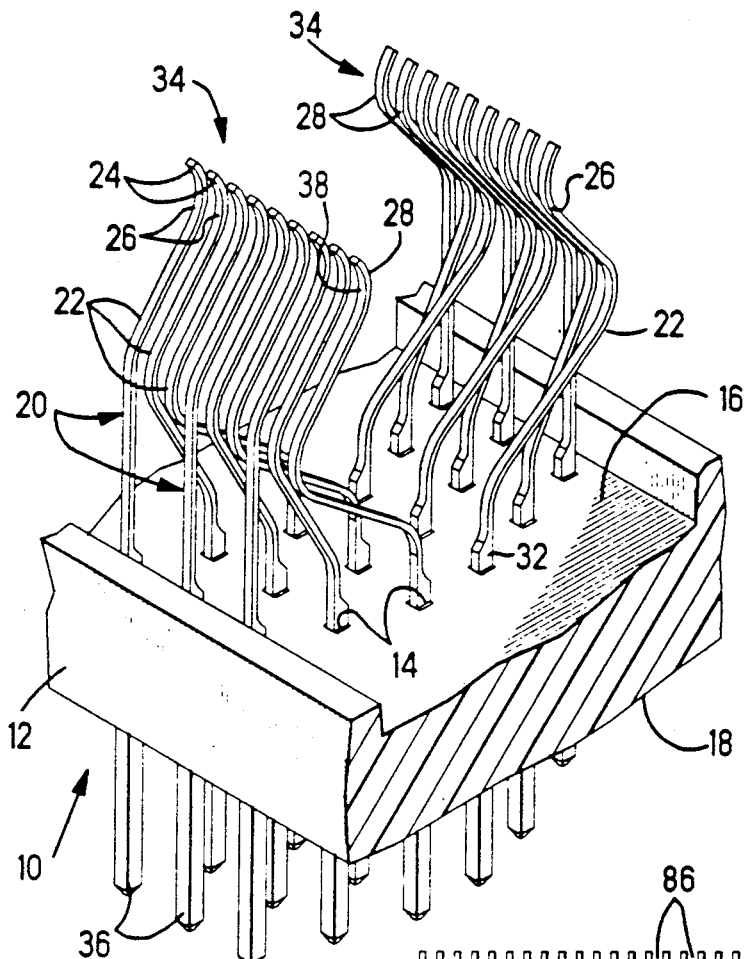
*Fig. 2*
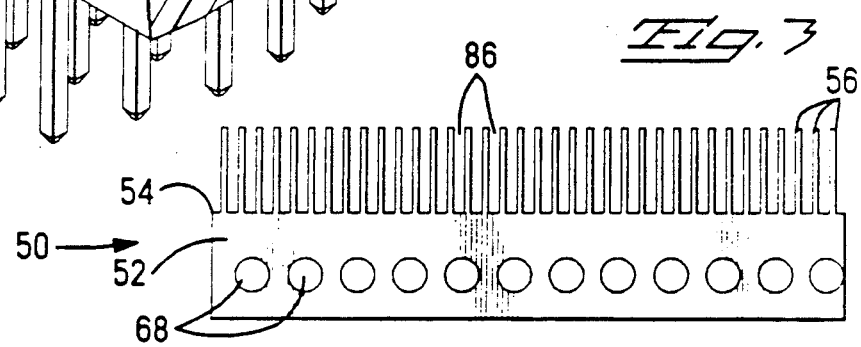
*Fig. 3*
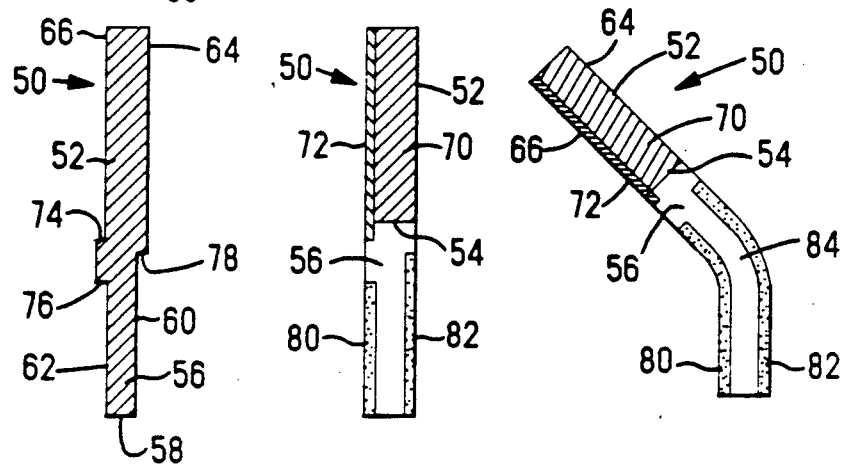
*Fig. 4*     *Fig. 5*     *Fig. 6*

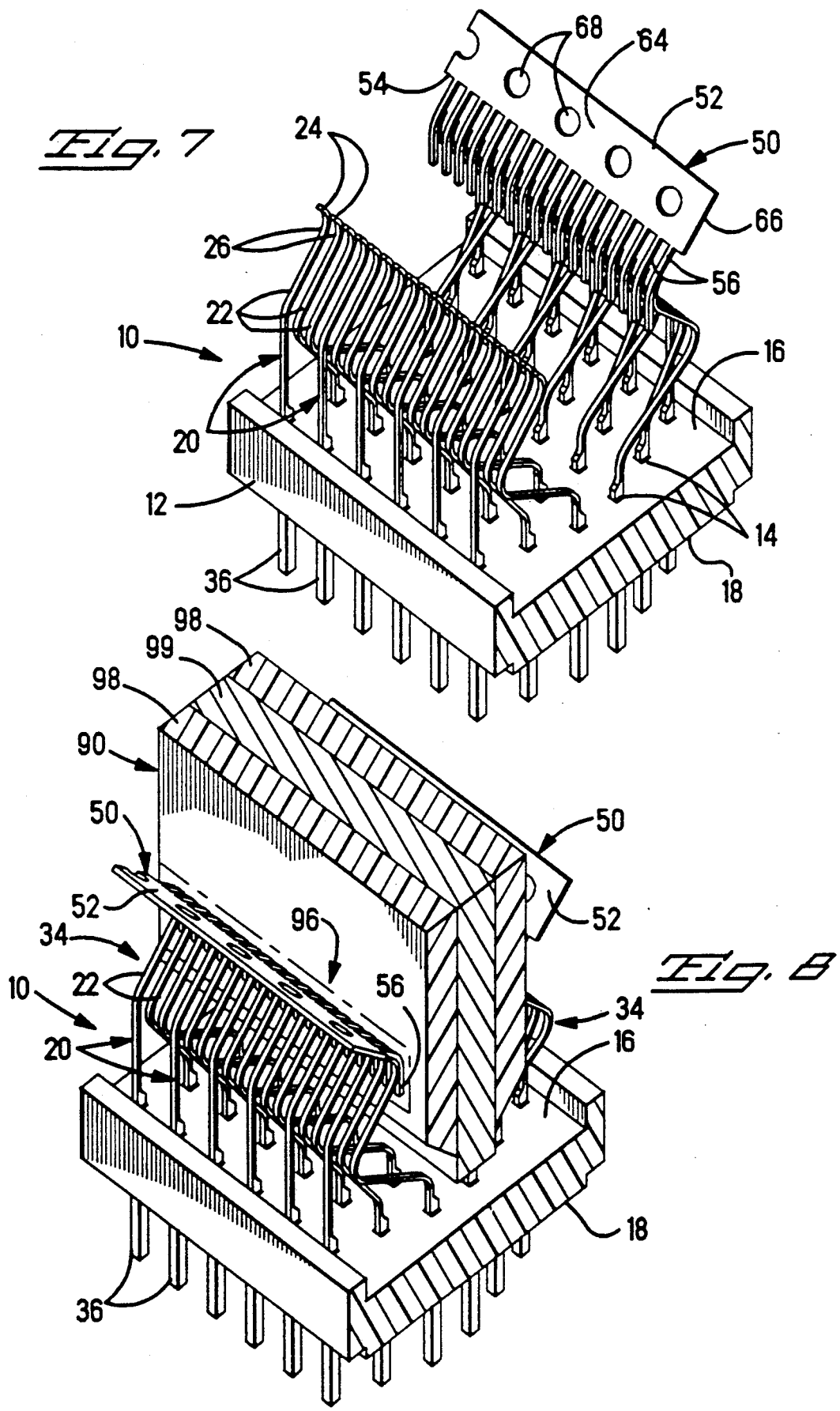

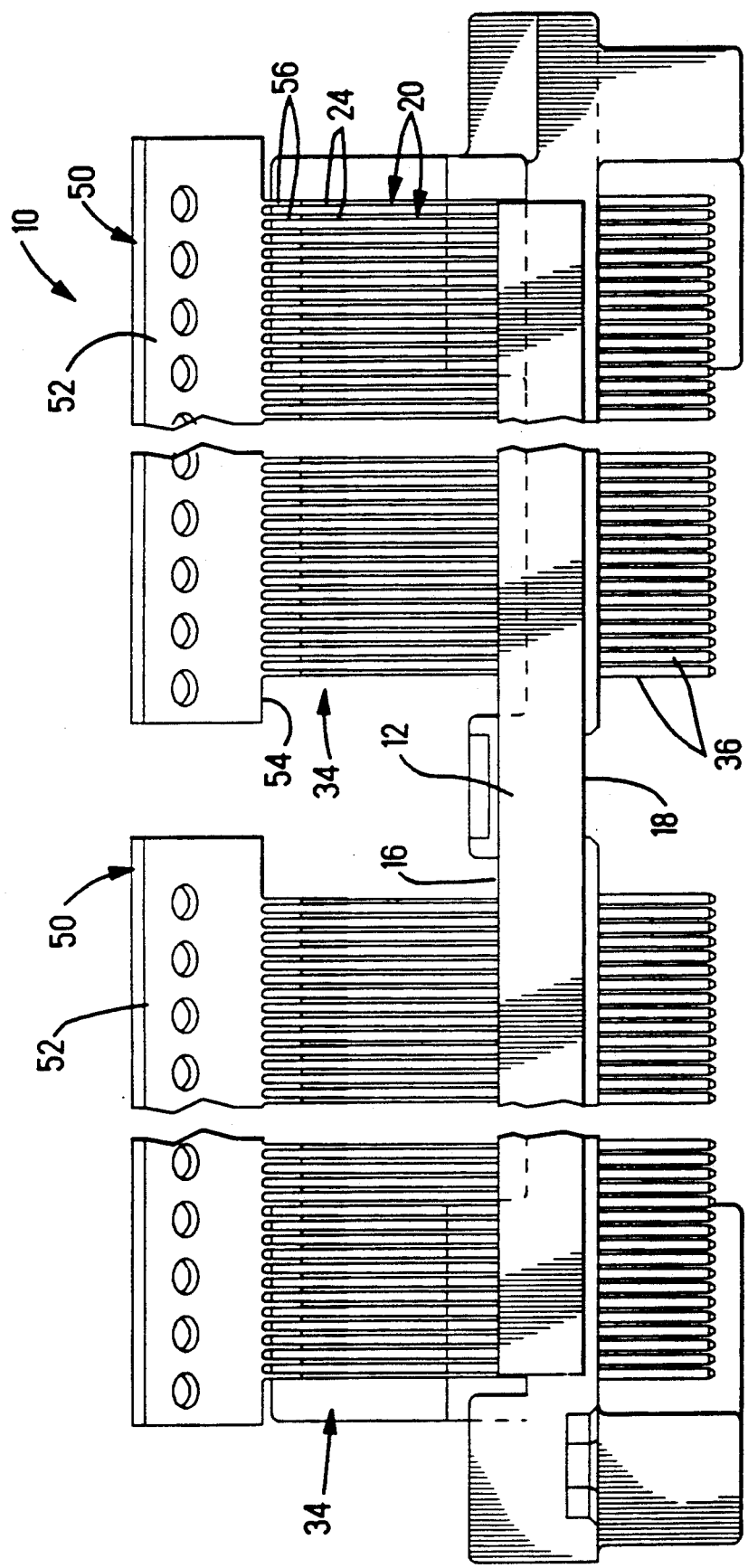

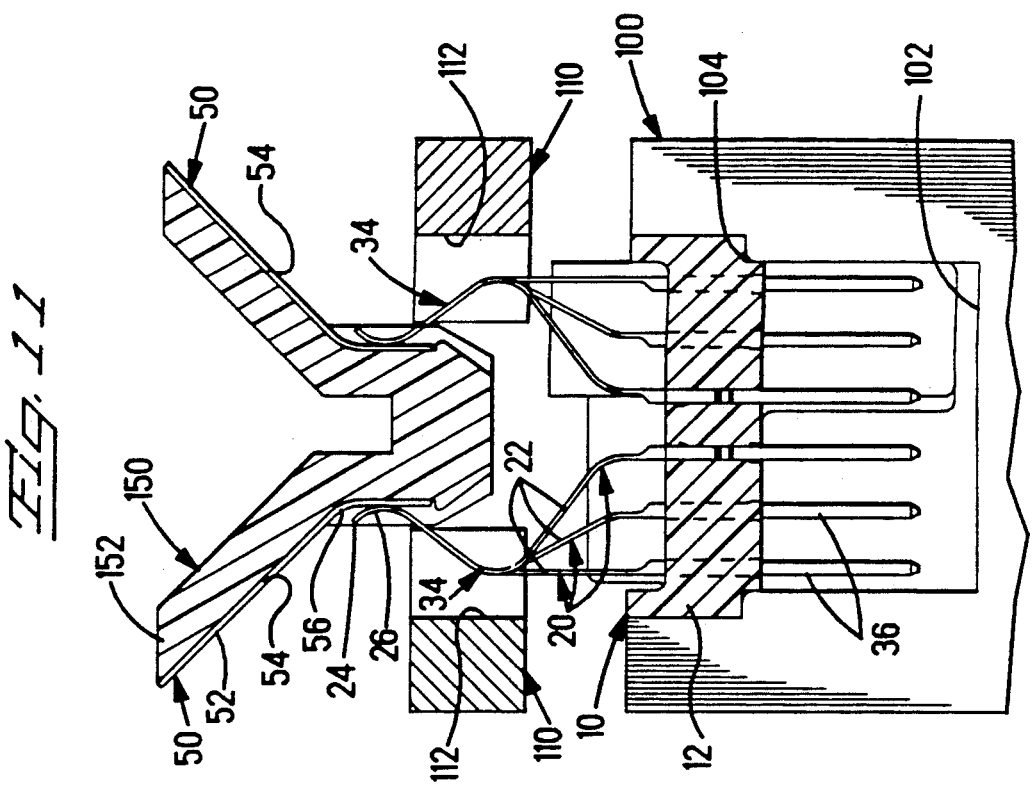
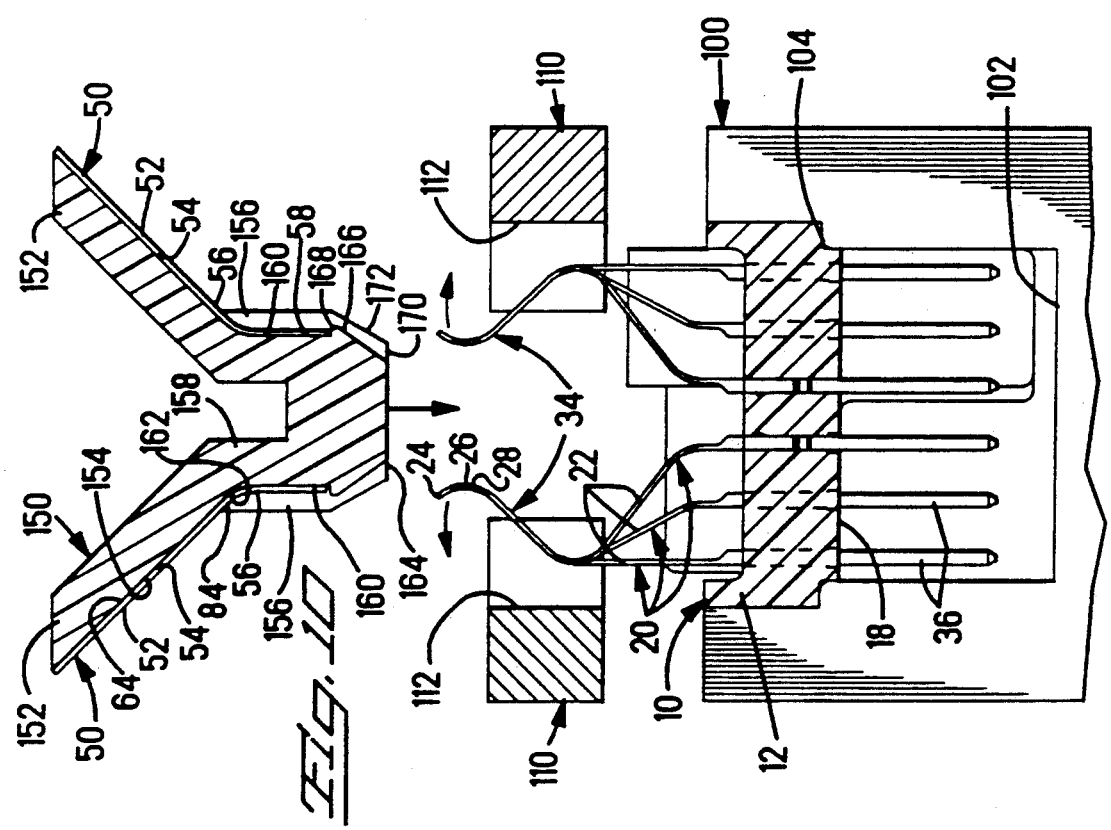

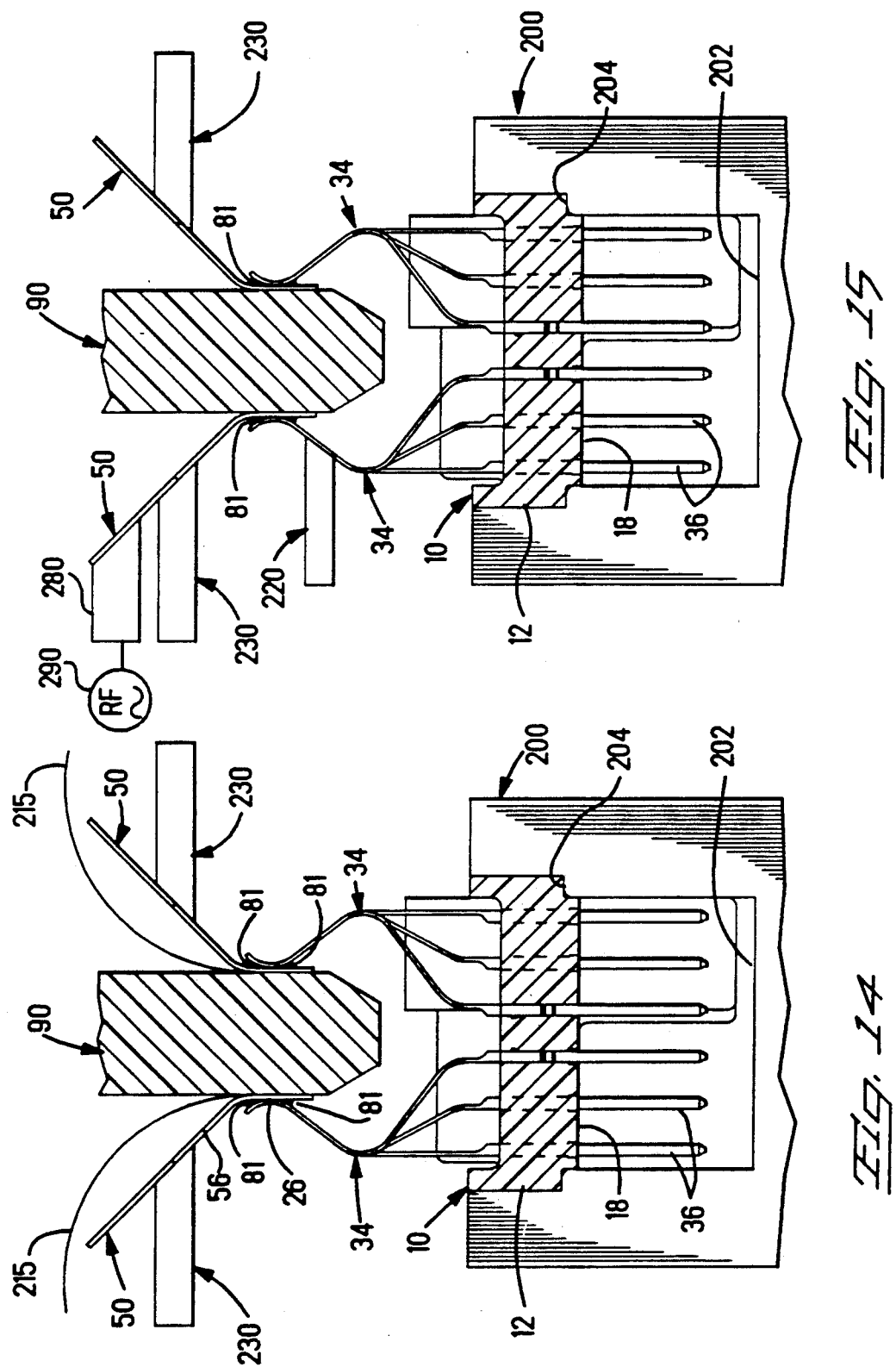

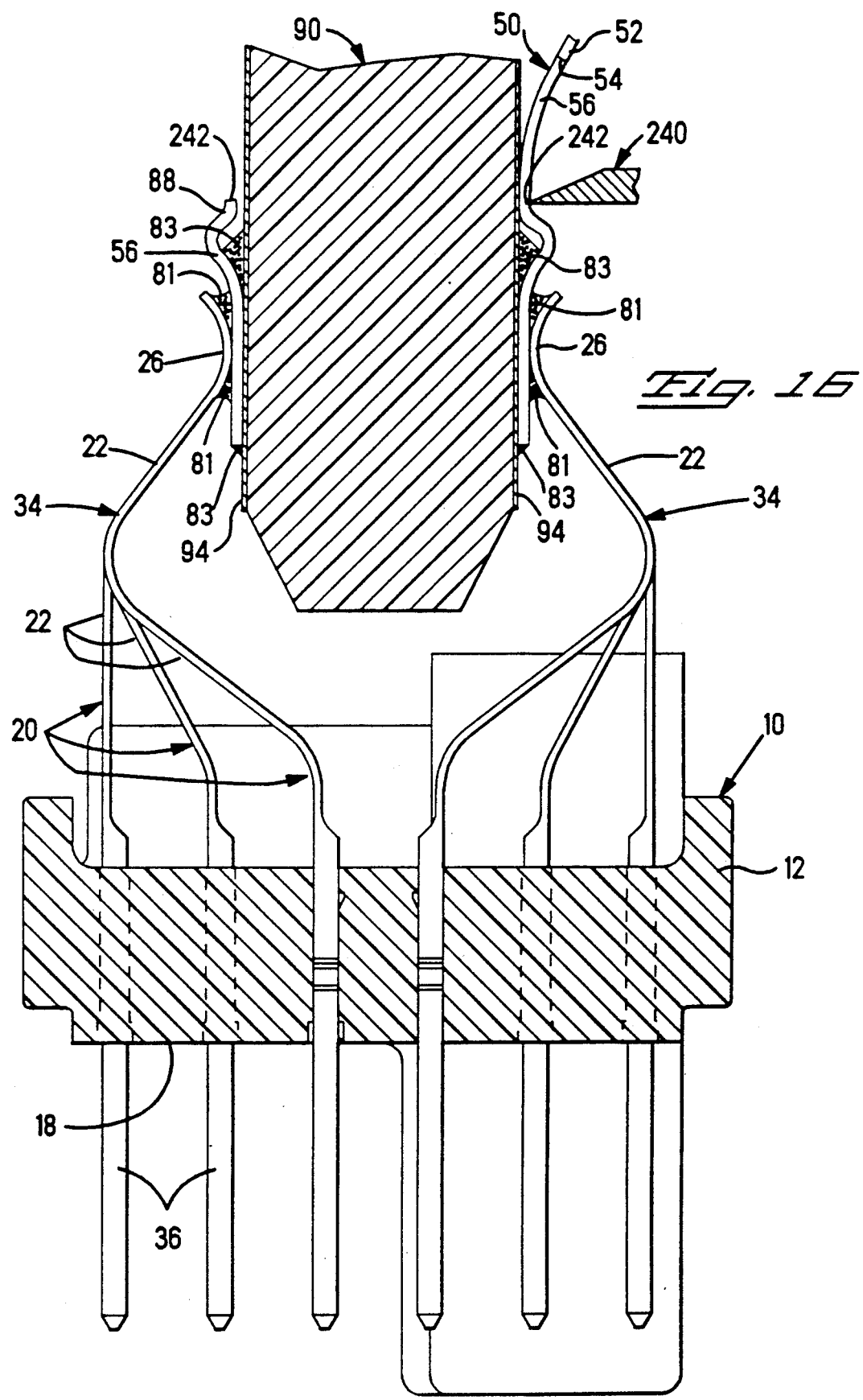

METHOD OF ASSEMBLING A CONNECTOR TO A CIRCUIT ELEMENT AND SOLDERING LEAD FRAME FOR USE THEREIN

FIELD OF THE INVENTION

The present invention relates to the field of electrical connectors, and more particularly to connectors for electrical connection to circuit elements such as printed circuit boards and the like.

BACKGROUND OF THE INVENTION

Electrical connectors are known which include a plurality of electrical contacts having exposed contact sections for electrical connection to circuits of a circuit element, such as conductive traces disposed on a major surface of a printed circuit board. U.S. Pat. Nos. 4,903,402 and 4,925,400 disclose similar such connectors which include two arrays of contacts each associated with respective arrays of conductive traces of circuit cards secured to opposed sides of a common central cooling plate of a module such as a line replaceable module (LRM), the connector being secured by fasteners to the cooling plate at an end thereof; the plate, the circuit cards and board-mounted components thereon, and the connector are disposed within protective covers of the module, with the connector having a mating face exposed at the end of the module for mating to another connector.

Arrays of such modules are commonly used in electronics units such as black boxes aboard aircraft, each matable with connectors on a mother board within the unit or box. The contacts are conventionally connected to the conductive traces of the circuit cards by their contact sections being soldered thereto in a surface mount arrangement; the contact sections are defined proximate free ends of elongate cantilever arms. The connector is mounted within the module in such a manner as to be incrementally movable transversely with respect to the module covers and the circuit cards affixed to the cooling plate, upon mating when the module is inserted into the electronics unit or black box; the elongate cantilever arms are flexible, and the incremental movement does not disturb nor overstress the soldered connections of the contacts to the conductive traces of the circuit cards.

U.S Pat. No. 4,903,402 also discloses a method of assembling the connector to the circuit cards previously affixed to the cooling plate, and a method of fabricating the connector to facilitate such assembly. The plurality of contacts of a row are stamped and formed while on a continuous carrier strip, as is conventional and the contact sections are precisely spaced apart a selected distance. The carrier strip is joined to the contacts of a row at the free ends of the elongate cantilever arms beyond the contact sections, which are formed into convex shapes enhancing fillet formation of the solder joints. Several rows of contacts associated with a single printed circuit element are to have their contact sections in a common plane to be joined to respective traces on a common surface of the circuit card; the carrier strips of the several rows are joined integrally together after the spaced contact sections of each row are registered with respect to those of the other rows to attain the desired spacing matching that of the trace array to which they will be soldered; the multirow array of contacts of the connector are handled as a unit during connector fabrication. The joined carrier strips are maintained on the arm free ends until after soldering is complete, whereafter the joined strips are carefully broken away in a manner not disturbing the solder joints. The method disclosed maintains the contacts precisely spaced apart to match the close spacing of the traces (such as 0.025 inches between trace centerlines), and minimizes tendencies of the elongate cantilever arms to be bent or broken or their spacing disturbed during handling prior to soldering, and thus eliminates the need for alignment tooling at the soldering operation of the type necessary to realign and again precisely space the contact sections of the individual arms to match the respective closely spaced traces.

In U.S. Pat. No. 4,852,252 electrical contact terminals are disclosed to be soldered to discrete wires after the terminals have been disposed within a dielectric housing, and the terminations sealed from the environment. The solder tail contact section of each terminal extends rearwardly from the housing rearward face; a length of heat recoverable dielectric tubing containing an annular preform of solder centrally along its length placed over the solder tail; the stripped end of the conductor wire is superposed over the solder tail within the tubing, and the solder preform is positioned around the superposed solder tail/wire end. The solder is then melted and flows around the solder tail and wire end, forming a solder joint electrically joining the wire and the terminal; the heat recoverable tubing shrinks in diameter until adjacent the portion of the conductor wire and the terminal within the tubing, and sealant material at ends of the tubing melts and seals the ends of the tubing to the wire insulation and dielectric material of housing flanges extending along a portion of each terminal exiting the housing sealing the termination and exposed metal from the environment.

U.S. Pat. No. 4,852,252 further discloses providing the terminals each with a thin layer of magnetic material along the surface of the nonmagnetic low resistance solder tail of the terminal facing away from the surface to which the wire end will be soldered; in U.S. Pat. No. 4,995,838 a preform of foil having a magnetic layer is disclosed to be soldered to the terminal solder tail's wire-remote surface. The bimetallic structure uses the Curie temperature of the magnetic material to define an article which will generate thermal energy when subjected to radiofrequency current of certain frequency for sufficient short length of time until a certain known temperature is achieved, above which the structure is inherently incapable of rising; by selecting the magnetic material and sufficient thickness thereof and selecting an appropriate solder, the temperature achieved can be selected to be higher than the reflow temperature of the solder preform; when the terminal is subjected through induction to RF current of the appropriate frequency, the solder tail will generate heat which will radiate to the solder preform, reflow the solder, and be conducted along the wire and the terminal and radiate further to shrink the tubing and melt the sealant material. The terminal thus includes an integral mechanism for enabling simultaneous soldering and sealing without other application of heat; excess heat is avoided as is the potential of heat damage to remaining portions of the connector or tubing.

Another U.S. Pat. No. 4,789,767 discloses a multipin connector whose contacts have magnetic material layers on portions thereof spaced from the contact sections to be surface mounted to respective traces on the surface of a printed circuit board. An apparatus is disclosed having a coil wound magnetic core having multiple shaped pole pieces in spaced pairs with an air gap therebetween within which the connector is placed during soldering. The pole pieces concentrate flux in the magnetic contact coating upon being placed beside the contact sections to be soldered, to transmit RF current to each of the contacts, generating thermal energy to a known maximum temperature to reflow the solder and join the contact sections to the conductive traces of the printed circuit element.

Such Curie point heating is disclosed in U.S. Pat. Nos. 4,256,945; 4,623,401; 4,659,912; 4,695,713; 4,701,587; 4,717,814; 4,745,264 and European Patent Publication No. 0241,597. When a radio frequency current for example is passed through such a bipartite structure, the current initially is concentrated in the thin high resistance magnetic material layer which causes heating; when the temperature in the magnetic material layer reaches its Curie temperature, it is known that the magnetic permeability of the layer decreases dramatically; the current density profile then expands into the non-magnetic substrate of low resistivity. The thermal energy is then transmitted by conduction to adjacent structure such as wires and solder which act as thermal sinks; since the temperature at thermal sink locations does not rise to the magnetic material's Curie temperature as quickly as at non-sink locations, the current remains concentrated in those portions of the magnetic material layer adjacent the thermal sink locations and is distributed in the low resistance substrate at non-sink locations It is known that for a given frequency the self-regulating temperature source thus defined achieves and maintains a certain maximum temperature dependent on the particular magnetic material. One source for generating radiofrequency current such as of 13.56 mHz is disclosed in U.S. Pat. No. 4,626,767.

The conductive substrate can be copper having a magnetic permeability of about one and a resistivity of about 1.72 micro-ohm-centimeters. The magnetic material may be for example a clad coating of nickel-iron alloy such as Alloy No. 42 (42% nickel, 58% iron) or Alloy No. 42-6 (42% nickel, 52% iron and 6% chromium). Typical magnetic permeabilities for the magnetic layer range from fifty to about one thousand, and electrical resistivities normally range from twenty to ninety micro-ohm-centimeters as compared to 1.72 for copper; the magnetic material layer can have a Curie temperature selected to be from the range of between about 200° C. to about 500° C., for example. The thickness of the magnetic material layer is typically one to three skin depths; the skin depth is proportional to the square root of the resistivity of the magnetic material, and is inversely proportional to the square root of the product of the magnetic permeability of the magnetic material and the frequency of the alternating current passing through the two-layer structure. Solders can be tin-lead such as for example Sn 63 reflowable at a temperature of about 183° C. or Sb-5 reflowable at a temperature of about 240° C. Generally it would be desirable to select a Curie temperature of about 50° C. to 75° C. above the solder reflow temperature.

It is desirable to simplify the process of soldering contact sections to circuit traces.

It is also desirable to eliminate the need at soldering to realign the individual ones of the plurality of contact sections at ends of elongate cantilever beam arms, and the combing tooling necessary to such individual arm realignment.

It is especially desirable to perform soldering in a process not subjecting all portions of the printed circuit element and the connector to the high temperatures requisite to reflow solder.

It is further desirable to simplify the providing of solder at discrete solder joint sites for such soldering.

SUMMARY OF THE INVENTION

The present invention is a method of soldering an array of contact sections of a plurality of contacts of a multicontact connector to a corresponding array of respective traces on the surface of a printed circuit element such as a VHSIC card or the like, without the need to precisely respace or realign each elongate cantilever beam arm of one or more rows of contacts of the connector with the respective traces utilizing expensive comb tooling in a time-consuming process, in order to perform soldering at a site remote from the site of manufacture of the connector. The connector is first fabricated with at least one array of one or more rows of contacts on each side, each array associated with a common trace-containing surface of a printed circuit element such that first contact sections of the terminals of each array are proximate free ends of the cantilever beam arms of the contacts and are disposed in a common plane even if the body sections of the contacts are arranged in a plurality of rows within the housing of the connector so that second contact sections at the other ends are arranged in a multirow array for mating with a mating connector. The first contact sections are disposed side-by-side at equally spaced intervals corresponding to the traces of the printed circuit element to which they are to be soldered.

A conductive strip or lead frame is fabricated having a plurality of thin, narrow fingers coextending transversely from an elongate common carrier strip, from a low resistance, low magnetic permeability metal such as beryllium copper. Each finger is spaced to be associated with a respective one of the first contact sections of one of the arrays of contacts of the connector. Along the carrier strip section a second layer is defined superposed on a major surface thereof, the carrier strip comprising the first layer, the second layer being of a metal which has high magnetic permeability and high resistance such as a nickel-iron alloy having a thickness of about 0.0005 inches or about one-and-one-half to two times the thickness of a "skin depth" of the particular metal. With the first contact sections being for example about 0.010 inches wide, the fingers would be as wide. The thickness of the fingers preferably is reduced by skiving on both the contact-proximate surface and the opposed trace-proximate surface to define recesses within each of which is deposited a respective inlay or preform of solder.

One of the lead frames thus defined, including the bimetallic carrier strip and the fingers with solder preforms on both sides, is then joined to the free ends of the elongate cantilever beam arms of each contact of each array, with the fingers superposed to coextend along the first contact sections thereof, on the trace-proximate surface, after which flux is preferably added. Through the use of comb tooling (during connector fabrication), the elongate cantilever beam arms are maintained precisely spaced from each other and the first contact sections held coplanar, and the fingers of the lead frame are maintained against the trace-proximate surfaces of the first contact sections; tooling of an apparatus for generating alternating high frequency, constant amplitude current of for example 13.56 mHz is positioned at least proximate, and may be held against, the magnetic layer of the carrier strip section of the lead frame and activated for a small length of time such as for example seven to ten seconds. Thermal energy is generated by the bimetallic carrier strip to a temperature higher than the melting point of the solder preform for a very brief time sufficient to reflow the solder preforms; the solder adjacent the contact section then cools to form a solder joint to the contact section. Preferably the trace-proximate surface of the fingers is supported by tooling having solder resistive surfaces; the solder of the opposed trace-proximate side of each finger simply resolidifies. Conductive strips may joined to both arrays of first contact sections sequentially or simultaneously.

The connector with lead frames joined to all of the arrays of elongate cantilever beam arms thereof then comprises an assembly ready to be soldered to a circuit element, such as VHSIC cards secured to both sides of a central cooling plate, or perhaps to both surfaces of a single two-sided circuit board. The circuit element is inserted between the lead frames of both arrays and between and against the trace-proximate solder preforms of the fingers of both strips and registration attained of the traces with the fingers and indirectly with the first contact sections on contact-proximate surfaces of the fingers. The presoldering steps are performable without the need to reassure alignment and spacing of the individual first contact sections since the bimetallic carrier strips of the lead frames maintain the spacing and alignment during handling and shipping of the connector assembly prior to soldering which may easily now be performed remote from the site of connector manufacture without expensive contact arm realignment and respacing and special alignment tooling therefor.

The contact sections are pressed against the respective traces to assure engagement of the solder preforms of the lead frame fingers with the traces; flux is again added at the solder sites; the bimetallic carrier strip is again engaged by RF-transmitting tooling of an RF generating apparatus; and the lead frames again generate thermal energy sufficient to reflow solder; solder joints are now formed joining the trace-proximate surfaces of the fingers to the conductive traces of the circuit elements, and the solder joints of the fingers to the first contact sections again resolidify so that the first contact sections are now soldered to the traces. The carrier strip extending away from the arm free ends and away from the solder joints is now carefully manipulated to be broken from the fragile fingers extending therefrom and removed from the now-soldered assembly, electrically isolating all the joints of first contact sections and circuit traces and defining discrete electrical connections of the connector contacts with the circuit element traces.

With the present invention, no manual soldering is thus necessary nor another conventional soldering process, such as a vapor phase reflow process, wherein the entire printed circuit element would be have to be subjected to high temperatures of the levels necessary to reflow solder in order to mount the connector contacts to the traces. With heat generated very quickly at only the solder sites for only a very brief time period, little heat remains to have deleterious effects. Delamination of conventional printed circuit boards as is common with hand soldering especially, is thus avoided. The present invention also enables electronic components such as integrated circuit chips and even optical devices such as LEDs and detectors and their associated terminated fiber optic cables to be mounted such as by soldering to the circuit element, prior to mounting the connector to the circuit element, if desired.

It is an objective of the present invention to fabricate a connector to have an integral means to maintain the precise spacing and alignment of pluralities of contact arms having contact sections defined thereon and especially when the contact arms are elongate cantilever beams, during shipping and handling prior to eventual soldering of the contact sections to conductive traces of circuit elements.

It is another objective to provide for a simplified process of soldering of the contact sections of a connector to conductive traces of circuit elements, and simplify the tooling necessary to prepare the connector for soldering at the soldering site.

It is yet another objective to provide a connector assembly having integral means to generate thermal energy at only the contact sections thereof to a selected known maximum temperature sufficient to reflow solder to define solder joints to conductive traces of circuit elements, thereby protecting all remaining portions of the connector and the circuit element.

It is an additional objective to provide such a connector with discrete solder preforms for its contact sections.

An embodiment of the present invention will now be described in detail, with reference to the accompanying drawings.

BRIEF DESCRIPTION OF THE DRAWINGS

FIG. 2 is an enlarged partial section view of a portion of the connector of FIG. 1 showing opposed arrays of elongate cantilever beam arms of the contacts extending from multiple rows in the housing to single opposed rows of free ends on inwardly facing surfaces of which are the contact sections in common planes to be soldered to the traces;

FIG. 3 is a lead frame according to the present invention with a plurality of fingers coextending from a carrier strip, the carrier strip having a layer of magnetic material thereon and the fingers having solder inlays thereon;

FIGS. 4 to 6 are enlarged cross-section views of the lead frame of FIG. 3, after skiving and stamping from a strip of copper alloy stock, after forming of the magnetic material layer and the solder inlays, and after bending respectively, with the thickness dimensionally greatly exaggerated;

FIGS. 7 and 8 are enlarged partial section perspective views of the connector of FIG. 1 having the lead frames of FIG. 3 soldered thereto, before and after insertion of the planar circuit element inserted between the opposed arrays of contact sections;

FIG. 9 is a broken elevation view of the connector of FIGS. 7 and 8;

FIGS. 10 to 13 are diagrammatic section views illustrating the method of securing the lead frame of FIG. 3 to an array of contact arms of the connector of FIG. 1, showing respectively, a lead frame on a support member being inserted between the contact arm arrays of the connector with the arms positioned within alignment comb tooling, the supported lead frame fully inserted in registration with the contact arms, one of the carrier strips engaged by RF-transmitting tooling to heat and reflow the solder inlays of one array, and the connector assembly after lead frames have been soldered to both of the opposing contact section arrays; and FIGS. 14 to 16 are diagrammatic section views of the connector assembly with lead frames of FIG. 13 being soldered to a planar two-sided circuit element, showing respectively, the connector assembly positioned in support tooling with the circuit element inserted between the contact section arrays and the traces thereof registered, the contact sections and fingers supported and the carrier strip for one of the arrays engaged by RF-transmitting tooling to heat and reflow the solder inlays, and the connector assembly soldered to both sides of the circuit element and the carrier strip being broken away from one side thereof.

DETAILED DESCRIPTION OF THE PREFERRED EMBODIMENT

Figure 1:
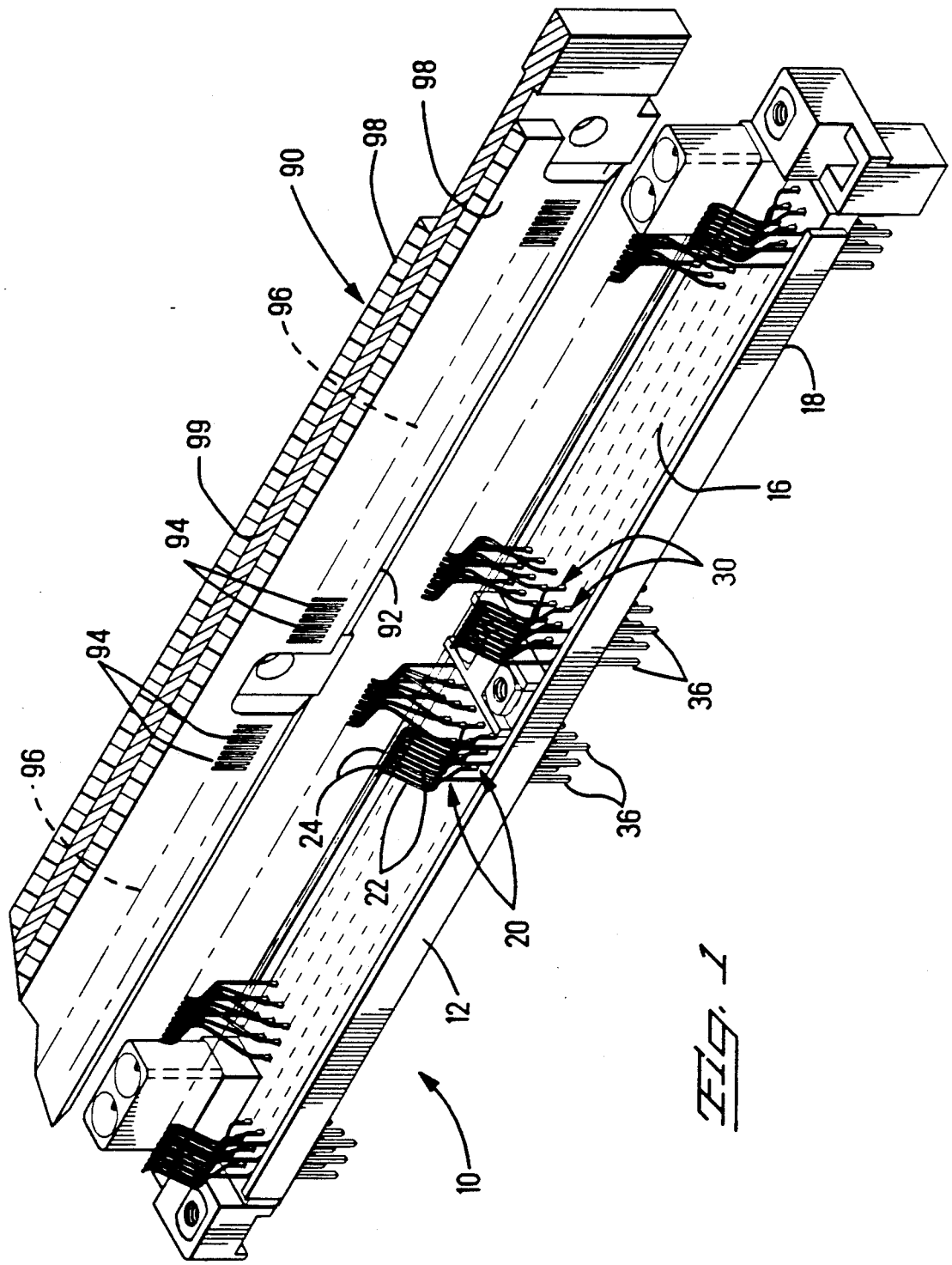
FIG. 1 illustrates a connector of the type with which the present invention is especially useful, having multi-row arrays of contacts extending from a mounting face in opposing pairs to be soldered to a planar circuit element inserted therebetween having conductive traces defined on surfaces thereof.

Connector 10 of FIGS. 1 and 2 is of the type to be mounted to an end 92 of a circuit element 90 to be enclosed within covers (not shown) to define a line replaceable module (LRM) similar to that disclosed in U.S. Pat. Nos. 4,903,402 and 4,925,400. Connector 10 includes a housing 12 of dielectric material such as polyphenylene sulfide having passageways 14 therethrough, with respective contacts 20 secured therein. Elongate cantilever beam arms 22 of contacts 20 extend rearwardly from mounting face 16 of housing 12 to free ends 24. First contact sections 26 proximate free ends 24 are arcuately shaped with trace-proximate surfaces 28 adapted to be soldered to corresponding traces 94 of circuit element 90 proximate end 92 thereof. Although not shown herein, the connector also will generally have an alignment means and keying members secured therein along the mating face; and the connector may optionally include passageways for fiber optic terminals to enable transmission of optical signals to and from the circuit element. Circuit element 90 may be a two sided printed circuit board (see FIG. 16) or, as shown, comprise a composite structure of a central cooling plate 99 on both sides of which are mounted Very High Speed Integrated Circuit (VHSIC) cards 98 near end 92 on which are defined traces 94 arranged in arrays 96; electrical and electronic components and, optionally, optical devices are then to be mounted on circuit element 90 within the covers of the LRM module which are connected to an electronic apparatus by connector 10 when mated with a mating connector of the apparatus.

Contacts 20 are shown arranged in longitudinal rows 30 along each side of housing 12, with arms 22 extending from body sections 32 disposed within passageways 14; the arms of the contacts in the different rows of each side have slightly differing lengths and formed into different cursive configurations so that free ends 24 of arms 22 of each side are side-by-side and the trace-proximate surfaces 28 are coplanar, defining opposed arrays 34; free ends 24 extend slightly outwardly from opposed arrays 34. Arrays 34 correspond with arrays 96 of conductive traces 94 of circuit element 90, with contact sections 26 precisely spaced to correspond with individual ones of traces 94. Contacts 20 also include second contact sections 36 extending forwardly of mating face 18 of housing 12 for electrical engagement with corresponding contacts matable therewith of a mating connector (not shown).

Second contact sections 36 and body sections 32 may have a square cross-section about 0.017 inches on a side, while arms 22 may have a cross-sectional configuration dimensioned about 0.010 inches along the array and a thickness of about 0.007 inches; elongate cantilever beam arms 22 thus are specifically adapted by shape, dimension and length to be flexible between free ends 24 and body sections 32. When first contact sections 26 are soldered to respective traces 94 of circuit element 90, and connector housing 12 is mounted thereto, connector 10 is incrementally movable with respect to circuit element 90 thus facilitating lateral adjustment of the connector during alignment with a mating connector when the completed module is inserted into the electronic apparatus (such as a black box) along guide channels of the apparatus. Contacts 20 may for example be formed of beryllium copper with nickel underplating and gold plating of second contact sections 36 and tin-lead plating on first contact sections 26.

FIGS. 3 to 6 show a lead frame 50 of the present invention, several of which are to be used with connector 10. Each lead frame 50 includes a carrier strip section 52 outwardly from one lateral edge 54 of which coextend a plurality of fingers 56 to free ends 58. Fingers 56 each are associated with and spaced to correspond with a respective first contact section 26 of an array 34 thereof, and fingers 56 are to be soldered to trace-proximate surfaces 28 of contact sections 26 as will be hereinafter described in detail. After lead frames 50 are secured by soldering to the respective arrays 34, a connector assembly will be defined which will be ready to be soldered to a race-proximate surfaces 28 of contact sections 26 and the trace-proximate surfaces 28 of contact sections 26 and the respective traces 94 after soldering, and can be said to themselves have a trace-proximate side 60 and a contact-proximate side 62 near free ends 58 thereof Carrier strip section 52 can also be said to have a trace-proximate surface 64 and a trace-remote surface 66, and also includes a plurality of regularly spaced registration holes 68.

In FIGS. 4, 5 and 6 carrier strip 52 and fingers 56 are initially stamped as an integral member from a thin strip of low resistance metal such as a copper alloy, and the copper alloy of strip 52 will be referred to as first layer 70; a second layer 72 of magnetic material is disposed along trace-remote surface 66 of first layer 70 of carrier strip 52 in intimate bonded relationship with first layer 70 such as is attainable with known methods of cladding a thin layer of metal to a metal surface. Preferably second layer 72 is incrementally thin and is disposed within a skived recess 74 of carrier strip 52. Each finger 56 is shown to have a reduced thickness by being skived on both contact-proximate side 62 to define a first recess 76 and on trace-proximate side 60 to define a second recess 78. All such skiving is preferably performed prior to stamping, and stamping may be performed on a copper alloy strip of double width thus creating a pair of continuous lead frames simultaneously which may be subsequently severed across the joined finger ends. Solder material is deposited in first recess 76 and second recess 78 to form first and second inlays or preforms 80, 82 respectively, such as by roll cladding or electrodeposition. After the magnetic material and the solder inlays are defined on the lead frame, the fingers are bent around a radiused bend 84 so that the carrier strip assumes an angle away from the side of its trace-proximate surface 64. Second inlay 82 extends farther along trace-proximate side 60 toward lateral edge 54 than first inlay 80, but preferably both inlays extend around bend 84.

Lead frame 50 may be fabricated from strip stock of a low resistance, low magnetic permeability metal such as brass or Copper Alloy C21000 of beryllium copper and having a thickness of about 0.010 inches before skiving. Second layer 72 is of a metal which has high magnetic permeability and high resistance, the second layer for example being Alloy No. A-42 of nickel (42%) and iron (58%) and having a thickness of about 0.0005 inches or about 1½ to 2 times the thickness of a "skin depth" of the particular metal. Each finger 56 may have a reduced thickness such as about 0.006 inches after skiving. The solder material of first and second inlays 80, 82 may be of Sn 63 having a reflow temperature of about 183° C., and inlays 80, 82 may each have a thickness of about 0.002 inches. Lead frame 50 may finally be formed to have a bend 84 of about 45° where fingers 56 join lateral edge 54 of carrier strip 52, with the ends of the slots 86 between fingers 56 adjacent lateral edge 54 preferably being radiused. Fingers 56 may have a width of 0.010 inches where the centerline spacing between traces 94 of circuit element 90 is 0.025 inches, which must also be the spacing of contact sections 26 of contacts 20 of connector 10. Were the centerline spacing to be 0.100 inches, fingers 56 and contact sections 26 could have a width of 0.030 inches; for a spacing of 0.050 inches, the fingers and contacts could have a width of 0.017 inches.

In FIG. 7 connector 10 is shown after a lead frame 50 is secured to a representative one of opposing arrays 34, and is then shown in FIG. 8 having lead frames along both arrays 34 after being soldered to a circuit element 90 having a trace array 96. Edges of end 92 of circuit element 90 are shown chamfered as is conventional in circuit element manufacture.

In FIG. 9 connector 10 is shown having conductor strips 50 soldered to respective arrays 34 of elongate cantilever beam arms 22 of contacts 20. Second contact sections 36 of contacts 20 extend forwardly from mating face 18 of connector 10 for mating with corresponding socket contacts of a mating connector (not shown). Connector 10 is shown fully fabricated and ready to be soldered to a circuit element, having integral alignment maintenance and spacing means, integral heater means and integral solder preform means, all defined by lead frames 50 secured to arms 22 of contacts 20. Connector 10 thus can be shipped to a site remote from its fabrication site in order to be soldered to a circuit element, and is adapted to be resistant to damage to elongate cantilever beam arms during reasonable handling. When connector 10 is fully fabricated, contact sections 26 of opposing arrays 34 are spaced slightly closer together than the thickness of circuit element 90 to be inserted between the arrays when connector 10 is soldered thereto, so that elongate cantilever beam arms apply spring force to contact sections 26 to ultimately generate assured moderate force against traces 94 of circuit element 90 during and after eventual soldering thereto to assist in establishing and maintaining appropriate solder joints therewith.

The method of soldering lead frames 50 to connector 10 is diagrammatically shown in FIGS. 10 to 13 inclusive which completes its fabrication, and the method of soldering a fully fabricated connector 10 to circuit element 90 is diagrammatically shown in FIGS. 14 to 16.

In FIG. 10, connector 10 is affixed within support tooling 100, nestled within connector-receiving cavity 102. Housing 12 rests on ledges 104 with contact sections 36 and other portions of connector 10 which extend forwardly of mating face 18 depend into the cavity. Comb portions 110 of tooling 100 define grooves 112 into which respective contact arms 22 are carefully received and held during soldering to respective fingers 56 of lead frames 50.

Also in FIG. 10, a lead frame 50 is affixed such as by being clamped to each side 152 of a strip support tooling head 150 so that trace-proximate side 64 of carrier strip 52 is disposed adjacent and against an angled surface portion 154 of side 152. The portion of each finger 56 of strip 50 forwardly of bend 84 is disposed within a discrete groove 156 of vertical portion 158 of support tooling 150 and against the bottom groove surface 160, and bend 84 of each finger 56 of strip 50 is nestled in corresponding bend 162 along the bottom surface 160 of groove 156.

Tooling head 150 is preferably formed of thermally insulative material which is dimensionally stable under high temperatures and is also inherently solder resistive along outer surfaces thereof, such as for example titanium or precision molded liquid crystal polymers such as are made by Celanese Specialties Corporation. Tooling head 150 can also be machined from stainless steel which is then oxidized or is coated with titanium nitride or chromate. Especially the side surfaces of grooves 156 and bottom groove surfaces 160 adjacent second solder inlays 82 on fingers 56 (see FIG. 6) should be solder resistive. Vertical tooling portion 158 is dimensioned to be about as wide between bottom surfaces 160 of opposed grooves 156 as the thickness of a circuit element 90 to which connector 10 will eventually be soldered.

Referring now to FIGS. 10 and 11, forward end 164 of vertical portion 158 is preferably adapted to facilitate receipt into respective grooves 156, of contact sections 26 of connector contact arms 22 upon insertion of strip tooling head 150 between arrays 34 of contacts 20. Connector 10 has been fabricated such that contact sections 26 of the opposing arrays 34 are spaced slightly closer together than the thickness of the circuit element for which connector 10 is intended. The process of soldering the lead frames 50 preferably takes advantage of the slightly closer spacing to enhance the soldering of fingers 56 to contact sections 26. Forward tooling end 164 includes beveled surfaces 166 along lateral corners thereof which will facilitate receipt of closer spaced contact sections 26 into grooves 160 by easily initiating outward deflection of free ends 24 of contact arms 22 when free ends 24 engage beveled surfaces 166, and tin-lead plated trace-proximate surfaces 28 bear thereagainst. Free ends 24 continue being deflected outwardly until adjacent small-radiused apices 168 whereat free ends 24 are spread apart just wider than fingers 56 of lead frame 50 are held by vertical tooling portion 158, to pass over finger ends 58 without snagging. Trace-proximate surfaces 28 of contact sections 26 will then engage under moderate spring pressure first solder inlays 80 of fingers 56 (see FIG. 6). Flux may now be deposited at each solder site such as by brushing the exposed contact arm free ends 24 with liquid flux such as RMA (rosin, mildly activated).

Even though tooling head 150 will be precisely registered with connector support tooling 100 (by conventional mechanical means not shown) for conductor strips 50 mounted thereon to be correspondingly registered with contact arrays 34, with contact arms 22 within grooves 112 of comb tooling 110 and fingers 56 within grooves 156 of strip tooling head 150. forward end 164 of strip tooling head 150 is preferably further adapted to facilitate receipt of free ends 24 into grooves 156. Leading edges 170 of ribs 172 defining grooves 156 are preferably slightly tapered so that in the event any of free ends 24 engage a leading edge 170 they will be deflected laterally to assuredly enter a respective groove 156 and will not snag.

Figure 12:
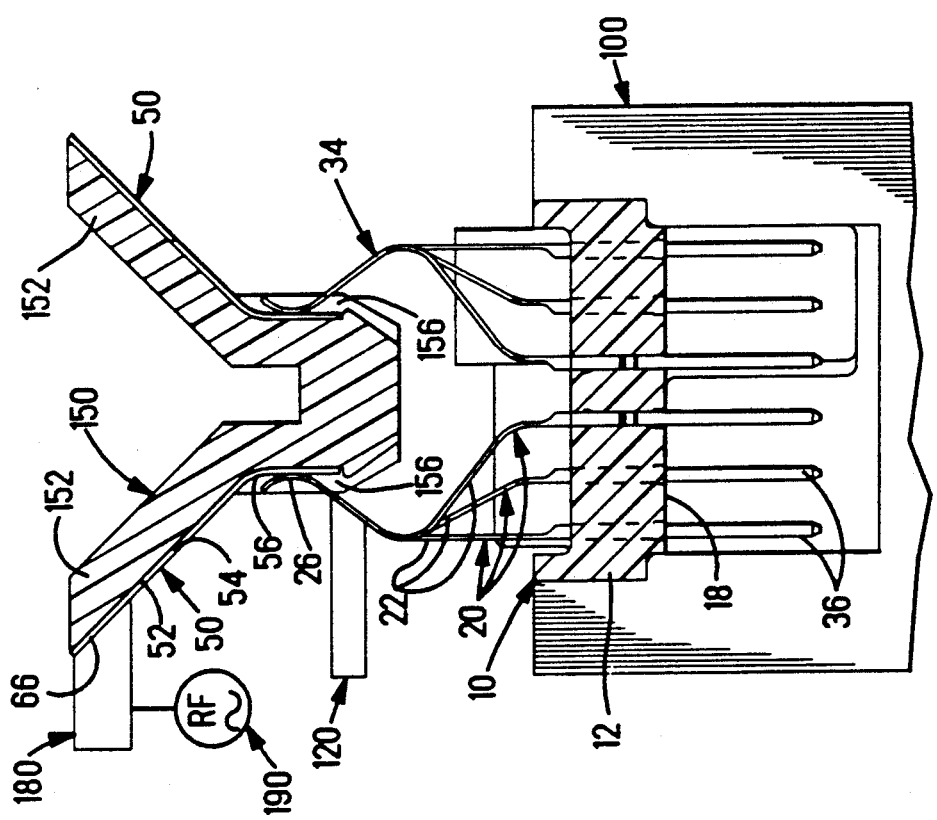

Referring now to FIG. 12, connector 10 and lead frames 50 are positioned to be soldered. With free ends 24 of contact arms 22 now disposed within grooves 156 of strip tooling head 150 adjacent fingers 56, and their lateral positioning now assuredly maintained, comb tooling 110 may now optionally be carefully withdrawn. Arm support tooling 120 is now brought adjacent outer surfaces of contact arms 22 to apply additional pressure on contact sections 26 against solder inlays 80 of fingers 56. Applicator tooling 180 is then brought firmly against trace-remote surface 66 of carrier strip 52 of lead frame 50, thereby being in intimate contact with magnetic layer 72. RF generator 190 generates an alternating high frequency constant amplitude current such as RF current having a frequency of 13.56 mHz, which is transmitted to magnetic layer 72 by applicator tooling 180 for a selected length of time; such an RF generator is disclosed in U.S. Pat. No. 4,626,767. Carrier strip 52 in response generates heat until a temperature is achieved equal to the Curie temperature of the magnetic layer for the given frequency. Such RF current can be applied for a short period of time such as seven to ten seconds, to achieve a maximum temperature such as 250° C. to melt solder such as Sn 63 having a reflow temperature of about 183° C.

Figure 13:
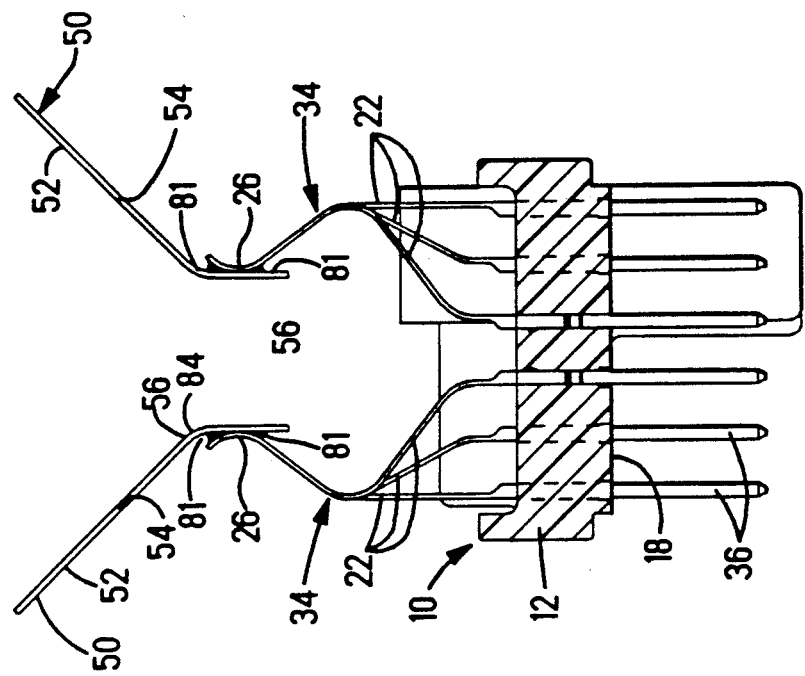

The thermal energy thus generated in response to the RF current is conducted along fingers 56 to solder inlays 80 which then reflow and form solder joints 81 with contact sections 26, as seen in FIG. 13. Preferably each lead frame 50 is soldered separately to its associated array 34 of contact sections 26. With strip tooling head 150 being thermally insulative, little thermal energy is drawn away from lead frame 50. With surfaces of tooling head 150 being solder resistive, no solder joints are formed joined thereto when solder inlays 82 are heated, and the melted solder does not wet the tooling surface and flow away from fingers 56; the solder of inlays 82 then resolidifies to remain as defined inlays or preforms Connector 10 is then cleaned to remove flux.

Connector 10 may now be handled and shipped to another site for assembly to a circuit element; when handled with reasonable care, lead frames 50 secured to arrays 34 of contact arms 22 will maintain the precise original desired spacing and the alignment of elongate cantilever beam arms 22.

In FIG. 14, connector 10 is again positioned within a cavity 202 of support tooling 200, similar to tooling 100, on ledges 204 thereof. Insertion of forward end 92 of circuit element 90 between arrays 34 of contact sections 26 is facilitated by use of thin plastic sheets 215 such as of MYLAR polyester film (trademark of E. I. du Pont de Nemours and Company). Incremental lateral movement of circuit element 90 then adjusts the position thereof to precisely register the alignment of the traces thereon with respective contact sections 26, facilitated by thin plastic sheets 215 which prevent snagging of side edges of the fingers of the lead frames 50 or disturbance of the solder inlays with the traces which may protrude incrementally above the surface of circuit element 90. Registration tooling 230 need not comprise a comb needing to be interdigitated with either contact arms 22 or fingers 56; tooling 230 is engaged to maintain the precise relative alignment or registration attained between the arrays of circuit element traces and the arrays 34 of contact sections 26, and then the thin plastic sheets 215 are carefully removed by being withdrawn vertically, after which solder inlays 82 (FIG. 6) defined on trace-proximate surfaces 60 of fingers 56 of lead frames 50, will be in engagement with traces 94 (FIGS. 1 and 8) of the circuit element; traces 94 will conventionally be plated with a coating of tin-lead alloy for enhancement of solder joint formation.

Soldering of connector 10 to circuit element 90 is shown in FIG. 15 Once again, contact arms 22 are pressed by support tooling 220 to generate pressure of contact sections 26 against corresponding traces of circuit element 90, and more precisely, of solder inlays 82 (FIG. 6) of fingers 56 of lead frame 50 against the traces. On an array-by-array basis, applicator tooling 280 is pressed firmly against trace-remote surface 66 of carrier strip 52 of lead frame 50 in intimate engagement with magnetic layer 72 therealong. (Optionally, carrier strip 52 may be supported by a thermally insulative member, not shown). Flux such as RMA is again preferably added to the solder sites. RF current is generated by RF apparatus 290 and transmitted to carrier strip 52; thermal energy is generated until the known maximum temperature is reached and maintained, and is conducted along fingers 56 to solder inlays 82. RF current such as 13.56 mHz is preferred, for a short period of time such as three to seven seconds, to achieve a maximum temperature such as 250° C. to melt solder such as Sn 63 having a reflow temperature of about 183° C. RF generator 290 may be similar to RF generator 190 of FIG. 12, for example of the type disclosed in U.S. Pat. No. 4,626,767.

The solder of inlays 82 reflows and forms solder joints 83 with traces of the circuit element 90, as seen in FIG. 16; the solder of solder joints 81 remains in place and resolidifies to reform solder joints 81. After soldering has been performed, carrier strips 52 may now be removed: preferably a blade-shaped tool 240 is brought against the outwardly facing surface of lead frame 50 between lateral edge 54 of carrier strip 52 and solder joint 83, pinning fingers 56 against circuit element 90 at locations 242 spaced a small distance from solder joint 83; carrier strip 52 is then pivoted back and forth two or three times for example, weakening the metal of thin fingers 56 until fracture occurs, after which carrier strip 52 is removed leaving small remnants 88 of fingers 56 adjacent the surface of circuit element 90, still aligned with respective traces 94 thereon. Connector 10 after soldering to circuit element 90 is again cleaned of flux.

Solder joints 83 and 81 define desired fillets in the areas between the arcuate surfaces and adjacent flat surfaces, or at end edges and side edges of the contact sections, the fingers and the traces, to establish assured electrical connections between the contacts 20 of connector 10 and traces 94 of circuit element 90. Mechanical securement can now be performed of connector housing 12 to circuit element 90 such as with conventional fastener members as disclosed in U.S. Pat. No. 4,903,402 and cover members secured therearound to define a line replaceable module, for example. In FIG.

16 another embodiment of circuit element 90 is depicted, comprising a printed circuit board having arrays of traces 94 on both major surfaces thereof.

Since the thermal energy generated by carrier strips 52 is transmitted only to the discrete solder sites, and only to a known carefully selected maximum temperature, and only for a very brief time period, the remainders of both connector 10 and circuit element 90 are now generally protected from substantial amounts of thermal energy, and circuit element 90 is able to be loaded, prior to securing the connector thereon, with electrical and electronic components whose solder joints to the element will not be affected by high temperatures. Also, optical devices such as light emitting and light detecting devices may be previously mounted thereon along with fiber optic cables having terminals on ends thereof to be inserted into corresponding passageways of connector 10 for transmission of optical signals to and from the circuit element.

Lead frames 50 assist not only the maintenance of spacing and alignment of elongate contact arms 22 but also the delivery of defined solder portions 82 to specific sites, are useful in yet another valuable way: to enable the generation of thermal energy at only the solder sites, which isolates the remainder of the circuit element and the connector from the degrading effects of high temperature and greatly simplifies the soldering process, in addition to the presoldering handling and eliminates the need for expensive and elaborate conventional tooling previously required therefor to realign and precisely space the contact arm free ends.

There may occur various modifications to the method disclosed hereinabove and to the lead frame of the present invention which will be within the spirit of the invention and the scope of the claims. For example, tooling head 150 which supports lead frames 50 during soldering to contact arm arrays 34 of connector 10, can optionally be fabricated to be flexed or "collapsed" or disassembled, all to facilitate being withdrawn from between arrays 34 after lead frames 50 are soldered thereto, without disturbing connector 10.

What is claimed is:

1. A method of preparing an electrical connector to be soldered to a circuit element, the connector of the type having at least one array of elongate contact arms extending from a mounting face to free ends defining contact sections disposed in a common plane for being soldered to a corresponding array of conductive means defined on a common surface of the circuit element to establish a plurality of electrical and mechanical connections between the connector and the circuit element, comprising the steps of:

providing a source for generating a constant amplitude high frequency alternating current of known frequency;

forming a lead frame corresponding to each said array of contact arms of said connector, each said lead frame having a carrier strip section and a plurality of fingers coextending from said carrier strip section each associated with and spaced to correspond with respective ones of said free ends of said elongate contact arms of said array, said lead frame being of a first metal having low electrical resistance and minimal magnetic permeability;

defining along said carrier strip section on a major surface thereof a second layer of a second metal having high electrical resistance and high magnetic permeability, said second layer having a thickness at least equal to one skin depth of said second metal, given said known frequency, said first metal of said carrier strip section being a first layer to which said second layer is intimately joined and said carrier strip section thereby defining a heater means integral to said lead frame;

disposing solder material on each said finger at least on opposed major surfaces thereof at least proximate free ends thereof, defining solder preforms, said solder material having a nominal reflow temperature slightly less than the Curie temperature of said second metal;

placing said lead frame in tooling means such that said end portions of said fingers are registered with and against respective ones of said free ends of said elongate contact arms of a corresponding said array of said connector, with said carrier strip section extending away from said connector;

generating said constant amplitude high frequency alternating current in said carrier strip section for a selected length of time, thereby generating thermal energy transmitted along said fingers to said solder material and reflowing said solder material which will form solder joints between said fingers and said free ends of said contact arms thus securing said lead frame to said array, whereby a connector is defined having an integral means to maintain the precise alignment and spacing of said coplanar free ends of said contact arms prior to soldering to a said circuit element, and further having an integral heater means and integral amounts of solder material at said free ends of said contact arms, all facilitating eventual soldering of said contact arms to respective said conductive means of a said circuit element whereafter said lead frame carrier strip section is removable to define discrete isolated circuits.

2. The method as set forth in claim 1 wherein said step of soldering said fingers of said lead frame to said contact arms free ends comprises soldering said fingers to trace-proximate surfaces of said free ends.

3. The method as set forth in claim 1 further including the step of bending said lead frame across the width thereof at a location between said carrier strip section and said solder material proximate ends of said fingers, so that said carrier strip section extends at an angle outwardly away from a circuit element region of said connector.

4. The method as set forth in claim 1 wherein said second layer is disposed on a trace-remote surface of said carrier strip section to facilitate engagement by RF current applicator means during said soldering.

5. The method as set forth in claim 1 wherein said second layer has a thickness of 1½ to 2 times the skin depth of said second metal.

6. The method as set forth in claim 1 wherein said lead frame is positioned onto a support means of thermally insulative material with said fingers of said lead frame being disposed along bottom surfaces of respective grooves in registration with said free ends of said contact arms of said connector, prior to soldering of said lead frame to said contact arm array.

7. The method as set forth in claim 6 wherein said grooves of said lead frame support means are defined by solder resistive surfaces, whereby upon reflowing of said solder material of said fingers said solder material remains unadhered thereto and remains adjacent said fingers and said contact arm free ends.

8. The method as set forth in claim 6 wherein said lead frame support means is adapted to support said carrier strip section along a trace-proximate surface thereof upon engagement by means for applying said known high frequency current thereto by engaging said second layer thereof disposed on a trace-remote surface of said carrier strip section.

9. The method as set forth in claim 6 wherein said lead frame support means is adapted for said grooves thereof to receive thereinto respective ones of said contact arm free ends upon positioning said lead frame adjacent said contact arm array.

10. The method as set forth in claim 9 wherein said connector includes a pair of opposed said arrays of contact arms spaced apart a distance slightly less than the thickness of a said circuit element to be disposed therebetween, and said lead frame support means includes a connector-proximate end having a thickness between said bottom groove surfaces greater than said interarray spacing, and a leading end of said connector-proximate end includes angled surfaces adapted to deflect outwardly said contact arm free ends upon engagement therewith during said lead frame positioning.

11. A method of securing an electrical connector to a circuit element, the connector of the type having at least one array of elongate contact arms extending from a mounting face to free ends defining contact sections disposed in a common plane for being soldered to a corresponding array of conductive means defined on a common surface of the circuit element to establish a plurality of electrical and mechanical connections between the connector and the circuit element, comprising the steps of:

providing a source for generating a constant amplitude high frequency alternating current of known frequency;

securing to said contact arm free ends of said connector a lead frame having a plurality of fingers each in registration with and joined to a respective said contact arm free end and having respective amounts of solder material secured thereto at least proximate trace-proximate surfaces of said contact arm free ends, said lead frame further including a carrier strip section defining an integral Curie point heater means adapted to generate thermal energy until achieving a known maximum selected temperature when subjected to said current of known frequency for a selected length of time, and said lead frame integrally maintaining the spacing of said contact arm free ends after said joining;

placing said circuit element adjacent said trace-proximate surfaces of said contact arm free ends with said conductive means in registration therewith;

generating said constant amplitude high frequency alternating current in said heater means for said selected length of time; and removing said carrier strip section from said fingers of said lead frame, thereby defining discrete electrical circuits, whereby thermal energy is generated by said carrier strip section and conducted to said contact arm free ends by said fingers and reflowing said solder amounts thereat and forming assured joints between said contact arm free ends and respective said conductive means of said circuit element, enabling said connector to be soldered to said circuit element without individually realigning and respacing said contact arm free ends in registration with said circuit element conductive means prior to soldering requiring tooling which must be especially adapted therefor, or for placing solder amounts at said joint sites or for subjecting the entire circuit element and connector to high temperatures necessary to otherwise reflow the solder material.

12. The method of claim 11 wherein said step of removing said carrier strip section of each said lead frame includes at least clamping said lead frame against an adjacent major surface portion of said circuit element by a sharp-edged tool at a location along said fingers between said carrier strip section and said soldered connections of said contact arm free ends to respective said conductive means and manipulating said carrier strip section outwardly of said location to weaken and break said fingers thereat.

13. The method of claim 11 wherein said circuit element includes arrays of said conductive means on both major surfaces thereof to be electrically connected to opposed arrays of contact arm free ends of said connector, and said circuit element is inserted between said opposed arrays prior to soldering, said method further including at least prior to circuit element soldering, the step of forming said opposed arrays of contact arm free ends to be spaced apart a distance slightly less than the thickness of said circuit element to which said connector is to be soldered.

14. The method of claim 13 further including the step of positioning a bearing substrate between said circuit element and each of said arrays of contact arm free ends for facilitating insertion of said circuit element between said opposed arrays prior to soldering and slightly deflecting apart said opposed arrays, and for facilitating incremental lateral movement relatively between said circuit element and said connector for registering said conductive means of said circuit element with respective said contact arm free ends of said connector, after which said bearing substrate is removed from between said circuit element and said contact arm free ends.

15. A lead frame for use in facilitating the soldering of an array of free ends of contact arms of an electrical connector to a corresponding array of conductive means of a circuit element, usable in conjunction with a source of constant amplitude high frequency alternating current of known frequency, comprising:

an integral member formed from strip of a first metal having low electrical resistance and minimal magnetic permeability, said integral member defining a first layer having a carrier strip section and a plurality of fingers coextending from said carrier strip section each associated with and spaced to correspond with respective ones of said free ends of said contact arms of said array;

said carrier strip section having defined on a major surface thereof and integrally joined to said first layer thereof a second layer of a second metal having high electrical resistance and high magnetic permeability, said second layer having a thickness at least equal to one skin depth of said second metal, given said known frequency, said carrier strip section thereby defining a heater means integral to said lead frame; and each said finger having solder material containing flux therein disposed at least on opposed major surfaces thereof at least proximate free ends thereof, defining solder preforms, said solder material having a nominal reflow temperature slightly less than the Curie temperature of said second metal, whereby a lead frame is defined securable to said contact arm free ends enabling said connector to be soldered to said circuit element without individually realigning and respacing said contact arm free ends in registration with said circuit element conductive means prior to soldering requiring tooling which must be especially adapted therefor, or for placing solder amounts at said joint sites or for subjecting the entire circuit element and connector to high temperatures necessary to otherwise reflow the solder material.

16. The lead frame as set forth in claim 15 wherein an array of precisely spaced and dimensioned holes are stamped into and along said carrier strip section defining means to move said lead frame to register said fingers with respective said contact arm free ends during the process of securing said lead frame to said array of contact arm free ends.

17. The lead frame as set forth in claim 15 wherein said integral member is skived to define a recess extending inwardly from ends of said fingers along at least one surface thereof within which solder material is disposed.

18. The lead frame as set forth in claim 15 wherein said integral member is formed to define a bend along the fingers at a location spaced slightly from said carrier strip section, and said solder preforms extend at least to said bend.

19. The lead frame as set forth in claim 18 wherein said integral member is bent in a direction towards said carrier strip section surface on which said second layer is defined.

20. The lead frame as set forth in claim 19 wherein said integral member is skived to define a recess extending inwardly from ends of said fingers and along a said major surface opposed from that on which said second layer is defined, and extending around said bend a slight distance, within which an amount of said solder material is disposed to define a said preform.

* * * * *